United States Patent [19]
Gabbert

[11] Patent Number: 6,038,239
[45] Date of Patent: Mar. 14, 2000

[54] TUNABLE ALIGNMENT-STABLE LASER LIGHT SOURCE HAVING A SPECTRALLY FILTERED EXIT

[76] Inventor: Manfred Gabbert, Barnimstr. 37, 10249, Berlin, Germany

[21] Appl. No.: 08/945,185
[22] PCT Filed: Apr. 19, 1996
[86] PCT No.: PCT/EP96/01640
§ 371 Date: Dec. 11, 1997
§ 102(e) Date: Dec. 11, 1997
[87] PCT Pub. No.: WO96/33536
PCT Pub. Date: Oct. 24, 1996

[30] Foreign Application Priority Data

Apr. 20, 1995 [DE] Germany .......................... 195 15 321

[51] Int. Cl.⁷ ..................................................... H01S 3/105
[52] U.S. Cl. ................................ 372/20; 372/98; 372/99; 372/101
[58] Field of Search ................................. 372/20, 23, 98, 372/99, 101, 102

[56] References Cited

U.S. PATENT DOCUMENTS

| | | | |
|---|---|---|---|
| 4,233,571 | 11/1980 | Wang et al. ............................. | 372/99 |
| 4,246,548 | 1/1981 | Rutz ....................................... | 372/44 |
| 4,426,707 | 1/1984 | Martin et al. ........................ | 372/98 X |
| 4,802,176 | 1/1989 | O'Meara ............................... | 372/20 X |
| 5,077,747 | 12/1991 | Hemmer et al. ......................... | 372/20 |
| 5,386,426 | 1/1995 | Stephens ................................. | 372/20 |
| 5,594,744 | 1/1997 | Lefevre et al. ........................ | 372/20 |

FOREIGN PATENT DOCUMENTS

| | | |
|---|---|---|
| 0347213 | 12/1989 | European Pat. Off. . |
| 0525752 | 2/1993 | European Pat. Off. . |
| AS2918863 | 11/1980 | Germany . |
| 4216001 | 9/1992 | Germany . |

OTHER PUBLICATIONS

Optics Letters, vol. 13, No. 10, Oct., 1988, pp. 826–828, Zorabedian et al.
IEEE Journal of Quantum Electronics, vol. QE–18, No. 2, Feb., 1982, pp. 155–157, Sato et al.
Electronics Letters, vol. 29, No. 10, May. 13, 1993, pp. 930–931, Foster et al.
Electronics Letters, vol. 27, No. 16, Aug. 1, 1991, pp. 1461–1462, Yeatman et al.
Optics Letters, vol. 16, No. 12, Jun. 15, 1991, pp. 910–912, Harvey et al.

*Primary Examiner*—John D. Lee
*Attorney, Agent, or Firm*—Birch, Stewart, Kolasch & Birch, LLP

[57] ABSTRACT

The invention relates to a laser light source having a broadband-amplifying and narrowband-tunable active medium, which involves an uncomplicated arrangement and is remarkable for the specific suppression of the broadband spontaneous emission and the side modes as well as for its optical stability. It included a laser medium itself, a preferably diffraction-limited optical system, an angular- or linear-dispersing element, and a reflector, the preferably plane reflector being arranged so as to form a retroreflector according to the cat's eye principle together with the imaging system, the reflector in addition being designed so as to be partially transmitting, and at the same time, a preferably non-reflecting space filter also being situated at least approximately in the plane of the reflector, so that only spectrally filtered radiation may pass the space filter, so that only the latter reaches the reflector, and there, separation of back-coupled and decoupled, usable radiation being effected at one single surface.

20 Claims, 7 Drawing Sheets

TUNABLE ALIGNMENT-STABLE LASER LIGHT SOURCE HAVING A SPECTRALLY FILTERED EXIT

BACKGROUND OF THE INVENTION

1. Field of the Invention

The invention relates to a tunable laser light source which involves an uncomplicated arrangement and is remarkable for its high optical stability and specific suppression of the broadband spontaneous emission (ASE: amplified spontaneous emission) and the side modes. One field of application for such a light source is the Raman spectroscopy, among others.

2. Related Art

Figure 1:
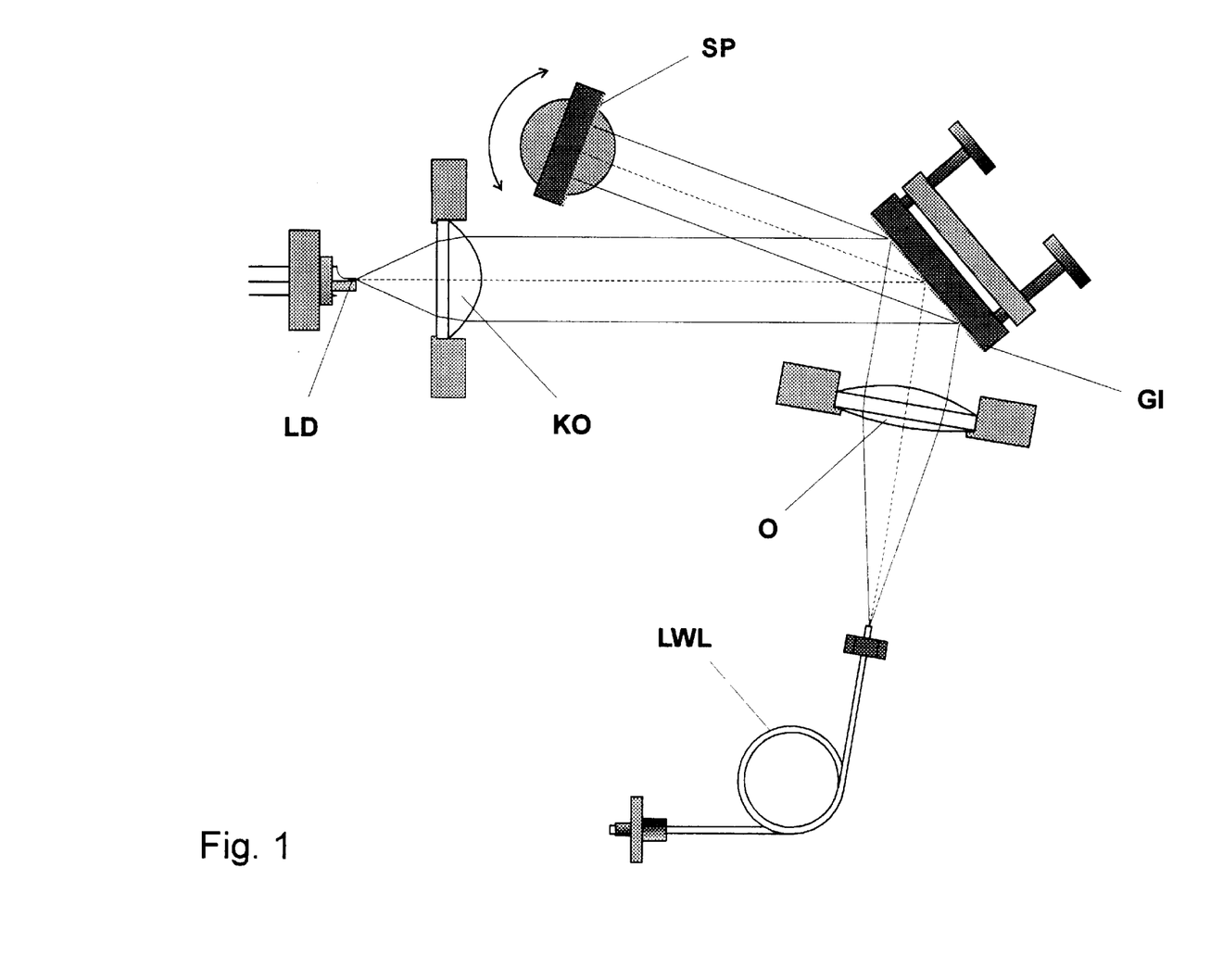
FIG. 1 shows a tunable laser light source according to well-known prior art.

Tunable laser light sources are known in many variants. FIG. 1 exemplifies a semiconductor laser arrangement. Appropriately modified, this configuration is also used in dye lasers. Essentially, it consists of the laser diode LD, a collimator KO, a diffraction grating GI for dispersing the laser radiation, and a plane mirror SP rotatable in the dispersion direction of the grating. The laser radiation forming an essentially parallel beam after the collimator KO is diffracted at the grating GI and reaches the rotatable mirror SP. Only those laser wavelengths diffracted in such a fashion as to strike the mirror SP substantially vertically return on the same path with sufficient accuracy and are imaged on the active laser facet, thereby generating an optical back-coupling. Thus, the wavelength range coupled back and hence, the emission major wavelength of the arrangement may be selected by merely rotating the mirror SP in the dispersion direction of the grating GI.

The usable laser radiation, on the other hand, is decoupled by the zero order diffraction of the grating, for which purpose the radiation is focussed, e.g., by a lens O in an optical waveguide LWL. Independently of the wavelength adjustment, the usable radiation always appears at the same position.

On the one hand, these arrangements which are widely used in the form of the above or a similar type, are disadvantageous in that they are highly sensitive even to minor maladjustment. For example, because the optically effective facet of a semiconductor laser is very small, the configuration is required to have particular stability with respect to inclinations of the optical path vertically to the dispersion direction. This involves the bearing of the rotatable mirror, the stability of grating support, laser and collimator. In such configurations, three degrees of freedom must be controlled, only one of which being imperatively required, namely, the rotation of the mirror for wavelength tuning. The displacement of the laser vertically to the dispersion direction of the dispersing element, as well as the displacement of the laser chip along the optical axis, which is required for focussing, must be held in optimum position without permitting any of the starting parameters to be changed. One aspect that complicates the problem is that these two independently adjustable coordinates cannot be optimized separately, so that naturally, there is only one optimum position in this two-dimensional method of adjusting. Frequently, a special procedure is used for this object.

Another drawback of such arrangements is that rather than spectrally purified radiation, a fraction of the entire radiation mix in the resonator, including the spontaneous emission and more or less strong side modes, is taken from the resonator as usable radiation. In addition, since decoupling of the radiation takes place through a path different from that of the back-coupling, barely avoidable reflections from the external arrangement wherein the laser radiation is used may have massive influence on the radiation in the resonator, unless additional means are employed, such back-coupling normally not taking place in a wavelength-selective fashion. Inherently, this is the case if an optical image of the laser facet is present on an at least partially reflecting, not necessarily mirroring surface (e.g., optical waveguide, receiver surfaces), because such arrays act as retroreflectors.

Solutions are known which either allow to obtain a radiation which is spectrally pure to a large extent, and those which increase the adjusting tolerance of such a laser resonator by using special measures, thus permitting to build up a comparably robust apparatus. Until now, however, an arrangement that would combine both of these features is not known.

In this context, the state of the art in obtaining spectrally pure radiation is represented by the DE-AS 29 18 863. In this invention, the radiation that has already left the resonator is essentially directed into a device for its spectral purification. Here, in particular, the dispersing element used in the wavelength selection of the laser is also used by said device under at least largely equal conditions, thereby achieving that it is always the appropriately filtered radiation which leaves the arrangement, regardless of the laser wavelength adjustment. However, the one drawback still remains that substantially, it is only the dispersing element which is used doubly and thus, various additional components are required for redirecting the radiation into the filter mechanism and for the latter itself. In a variant of the above-mentioned DE-AS 29 18 863, an arrangement is described where part of the filtered radiation remains in the resonator or is returned into same. However, apart from the dispersing element, both laser and filter device are present therein as well. In addition, a substantial part of non-filtered radiation leaves the resonator through a separating mirror which is necessarily present, so that this part is lost.

The DE OS 42 16 001 A1 is also directed to obtaining spectrally purified radiation. Therein, the entire radiation in the resonator and the spectrally purified fraction pass through the resonator at different angles, thus enabling their separation. However, several components are operated under grazing incidence, thereby impairing the applicability of the above invention. In addition, the spectrally purified radiation as well passes through the laser medium one more time, thereby rendering the spectral purity doubtful again.

Essentially, the state of the art for increasing the alignment tolerance in lasers having external resonators is governed by two solutions: The first solution is described in P. Zorabedian and W. R. Trutna, Jr.: Interference-filter-tuned, alignment-stabilized, semiconductor external-cavity laser, *OPTICS LETTERS*, Vol. 13, No. 10, pp 826–828. A cat's eye retroreflector (converging lens with a mirror in its focal plane) is used in the alignment-tolerant back-coupling of laser radiation. In the parallel optical path inside the resonator, there is an interference filter as selective element. For tuning the laser wavelength, said filter is supported rotatably. The decoupling of the usable radiation takes place from that facet of the laser chip which is on the side facing away from the external resonator.

However, this arrangement involves the drawbacks that the broadband spontaneous emission and the side modes cannot be separated without using substantial additional means, and there are limitations resulting from the properties of an interference filter.

The EP 0,525,752 A1 includes another way to build up an alignment-stable laser having an external resonator. Therein as well, a cat's eye retroreflector is used in principle, but its effect is limited to one coordinate. By means of a suitable combination of prisms and a cylinder lens for beam shaping, and by using a diffraction grating as reflector, it is found that the laser facet is imaged on the grating only vertically to the dispersion direction. In dispersion direction, however, the radiation beam striking the grating is mainly parallel and relatively broad. In this way it has been achieved that the grating can be used for tuning the laser wavelength without restriction and, on the other hand, the arrangement is largely tolerant with respect to inclination of the grating vertically to the dispersion direction. Without additional means, however, this arrangement neither permits separating the broadband spontaneous emission and side modes from the usable fraction of radiation.

SUMMARY OF THE INVENTION

The invention is therefore based on the object of finding a resonator arrangement for a broadband-amplifying, narrowband-tunable laser medium, specifically a semiconductor laser, which has an uncomplicated configuration and is remarkable for its high alignment-tolerance and, at the same time, the substantial absence of ASE and side modes.

This object is achieved by means of the features in the characterizing part of the main claims in combination with the features in the respective preamble. Convenient embodiments of the invention are included in the subclaims.

Here, it is a particular advantage that the collimated laser radiation passes through an angular- or linear-dispersing element and subsequently arrives in a special cat's eye retroreflector including a space filter at the site of its reflector, such that in context with the dispersion of the dispersing element, only spectrally filtered radiation passes the space filter, and in addition, the above-mentioned reflector is of partially transmitting design, so that the same, selected radiation both is used in the alignment-stable back-coupling and is directed out of the resonator as usable fraction. Because the fraction of radiation reflected from the decoupling surface into the resonator is also intended for the back-coupling, the problem of undesirable reflections at the decoupling surface is eliminated. Likewise, possible reflections from the arrangement processing the usable radiation have only minor disturbing effects even without additional means, because such possible interference back-coupling exclusively contains the selected wavelength.

BRIEF DESCRIPTION OF THE DRAWINGS

In the following, the invention will be illustrated with reference to several embodiments.

DETAILED DESCRIPTION OF THE PREFERRED EMBODIMENTS

Figure 2:
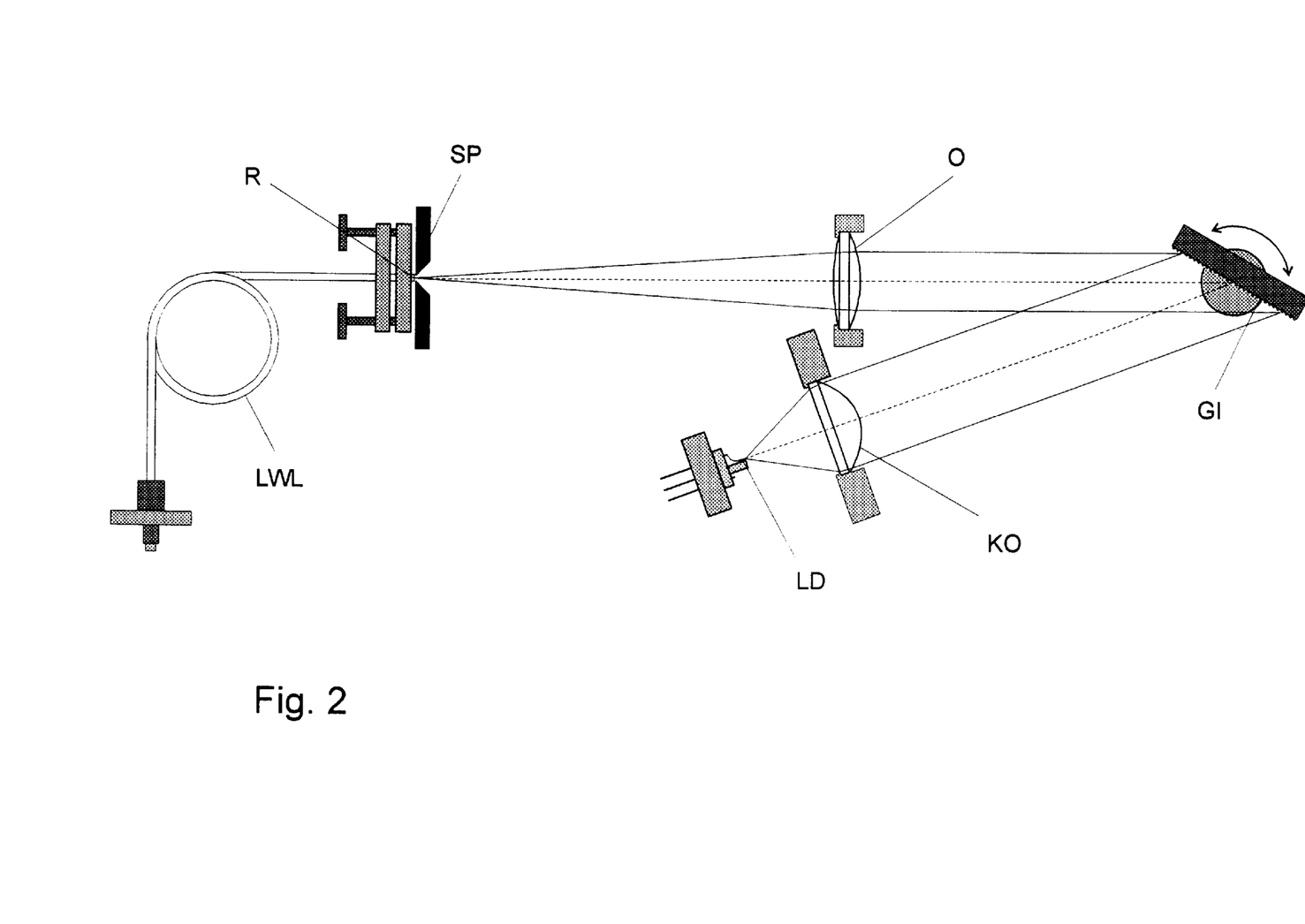
FIG. 2 shows a schematic representation of the basic variant of the invention.

The basic variant of the invention is illustrated in FIG. 2. Initially, the radiation from the laser medium LD which is a laser diode in the present embodiment, is transformed into a substantially parallel beam by the collimator KO which permits diffraction-limited imaging and conveniently, consists of a non-sphere. Said beam is passed to the dispersing element GI arranged rotatably in dispersion direction, which in this case is a diffraction grating and is conveniently designed for very high efficiency for the intended wavelength range at the present polarization direction. Due to the low fraction of scattered light, a grating produced using holography is particularly suited for that purpose. The diffracted radiation of the respectively selected wavelength is passed to a part O of the imaging system which in the present embodiment, is a similarly diffraction-limited lens which generates an image of the optically effective laser facet in the plane of space filter SP designed as a slit. The slit SP allows to pass only radiation of a narrowly limited wavelength interval around the selected wavelength. Conveniently, the slit SP is chosen such that the fraction of radiation which is not allowed to pass is reflected neither. This may be achieved by blackening the slit SP and/or by a suitable geometry of the slit jaws. Substantially in the same plane as the slit SP, there is the plane-polished partially mirror-coated front surface of an optical waveguide LWL. The ratio of reflected to transmitted radiation may be optimized by producing the appropriate partial mirror coating. The surface of the reflector R, together with the slit SP now provides for the selective back-coupling. At the same time, the radiation filtered in this way is fed into the optical waveguide LWL as usable radiation. Alignment deviations involving inclination of the grating GI vertically to the dispersion direction, or equally effective faults, or an inclination of the optical waveguide facet have a comparably small effect due to the cat's eye retroreflector, whereby said high alignment stability is achieved.

Figure 3:
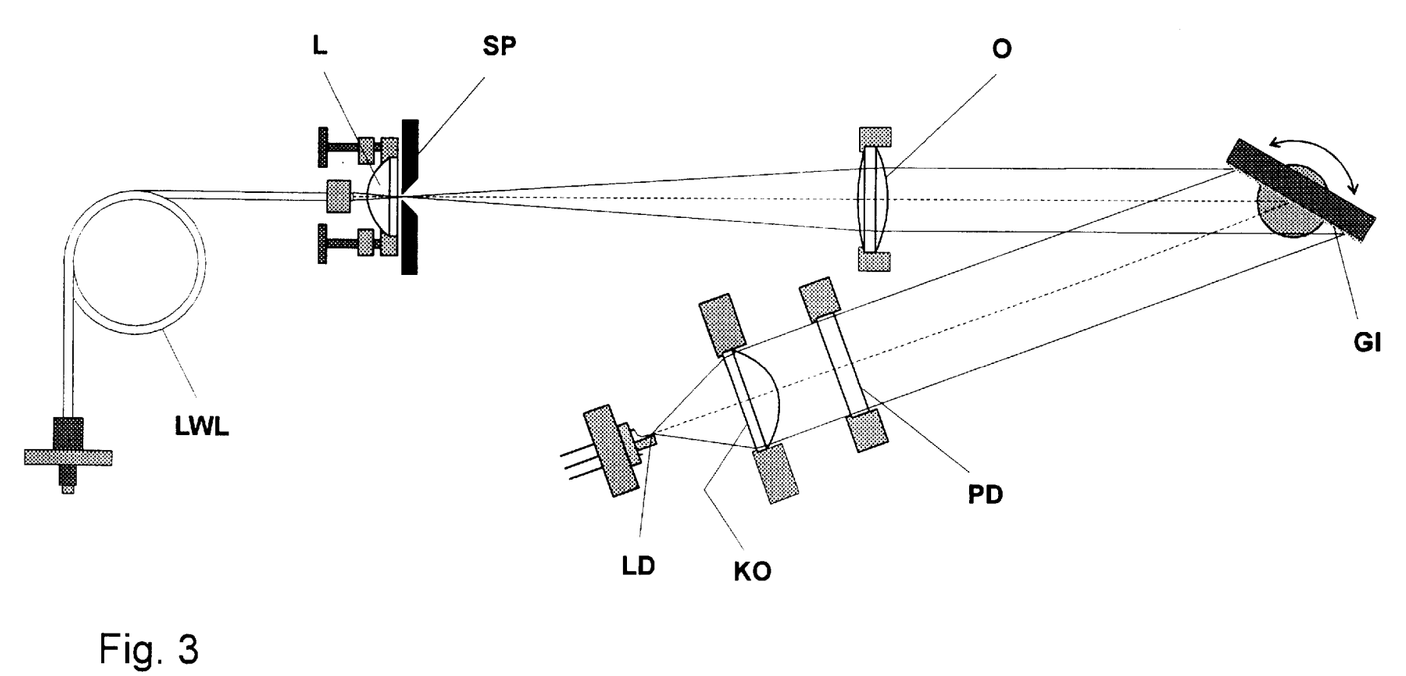
FIG. 3 shows a schematic representation of a first embodiment.

For many uses, as well as for Raman spectroscopy in particular, a spectrally pure radiation is required, with a robust configuration and at the same time, high available radiated power. To this end, another embodiment is provided (FIG. 3). A broad-fringe laser diode extensively reflection-reduced on one side serves as laser medium. Because the optically effective facet of such a diode frequently is wider than that of low-power laser diodes (typically, e.g., 0.2 mm –0.5 mm, as compared to a few $\mu$m with low-power laser diodes), the resonator arrangement needs to be modified. In order to achieve the desired spectral narrow band in context with the broad facet, only one arrangement of the facet parallel to the slit SP and parallel to the grating grooves is possible. However, semiconductor lasers usually emit with the E vector polarized parallel to the pn junction (the optically effective facet is also in the plane of the pn junction). However, maximum diffraction efficiency of the grating GI may only be achieved where the E vector is substantially vertical to the grating grooves. In order to solve this problem, a suitable 90° polarization rotator PD, e.g., a $\lambda/2$ plate is inserted in the parallel optical path between collimator KO and grating GI. Now, if the configuration is designed so as to enable a spectral narrow band of selection as described above, the polarization plane of the radiation is rotated in the direction required for high diffraction efficiency, before the radiation reaches the grating GI. After the grating GI has been passed in the forward and reverse directions, the polarization rotator PD takes effect again, so that the back-coupled radiation strikes the laser in its original direction of polarization.

Another problem in context with the use of broad-fringe lasers is that the image of the laser facet normally becomes so large that coupling into a sufficiently thin optical waveguide LWL is no longer possible. Due to these circumstances, said image is enlarged by a multiple with respect to the original facet.

The above-mentioned problem may therefore be solved in such a way that the laser facet is not imaged onto an end of the optical waveguide but rather, onto the plane, partially mirror-coated surface of a decoupling lens L designed as a plane-convex lens. In the focal plane of said lens L, the size of the laser facet image on the lens L is no longer important. Here, the size of the focal spot in the focal plane of lens L only depends on its focal distance and the aperture of the radiation that is used to create the image of the laser facet on lens L. In context with the above-mentioned enlarged image of the laser facet, this would mean that this aperture is comparatively small, so that, according to this principle, coupling into a sufficiently thin optical waveguide LWL may be effected.

A line of laser diodes may also be used instead of the broad-fringe laser. In this event, the arrangement of the invention is advantageous in that substantially each single diode undergoes accurate back-coupling with itself.

Another embodiment of the invention involves using substantially an arrangement with a line of laser diodes as in FIG. 3, with the difference, however, that the plane-polished, partially mirror-coated ends of optical waveguides LWL, similar as in FIG. 2, are used as back-coupling and decoupling elements, namely, in such a way that the image of each single diode is assigned an optical waveguide LWL of its own. In this fashion, a multiple laser light source is obtained allowing synchronous tuning of all sub-light sources at the same time with only one element. Due to the coupling into optical waveguides LWL, the laser radiation may be conveyed simultaneously to sites relatively far apart from each other. This property may be particularly advantageous in Raman spectroscopy, all the more because Raman spectrometers capable of recording multiple spectra are already available, the Raman radiation normally being passed to the spectrometer via optical waveguides LWL.

Figure 4:
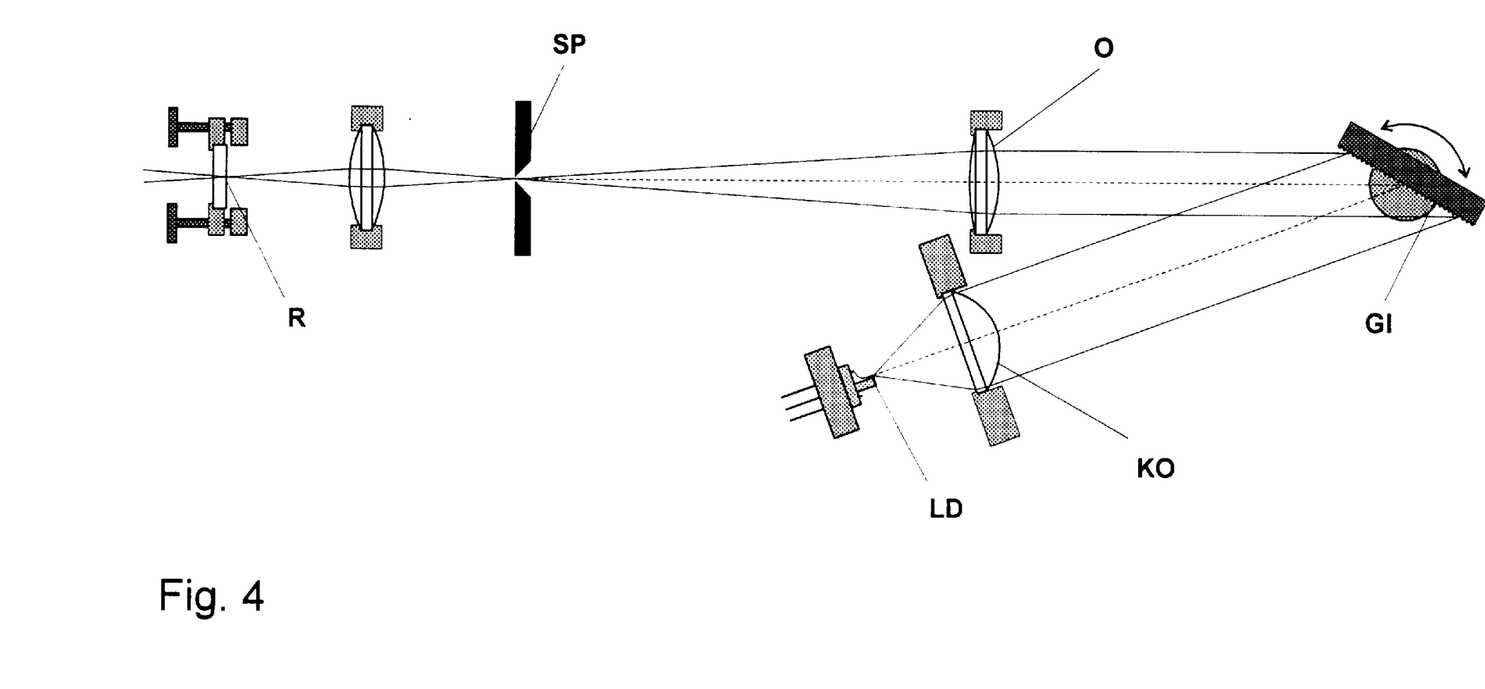
FIG. 4 shows a schematic representation of a second special embodiment.

Under certain circumstances, it may be advantageous to arrange the space filter SP spatially separated from the reflector R. In this event, imaging of the space filter SP may take place behind the space filter SP, viewed in beam direction, the reflector R being arranged at the imaging site of the space filter SP. An example of this principle is illustrated in FIG. 4.

Another variant of the invention (FIG. 5) involves further reduction of the decoupled luminescence and side modes.

Figure 5:
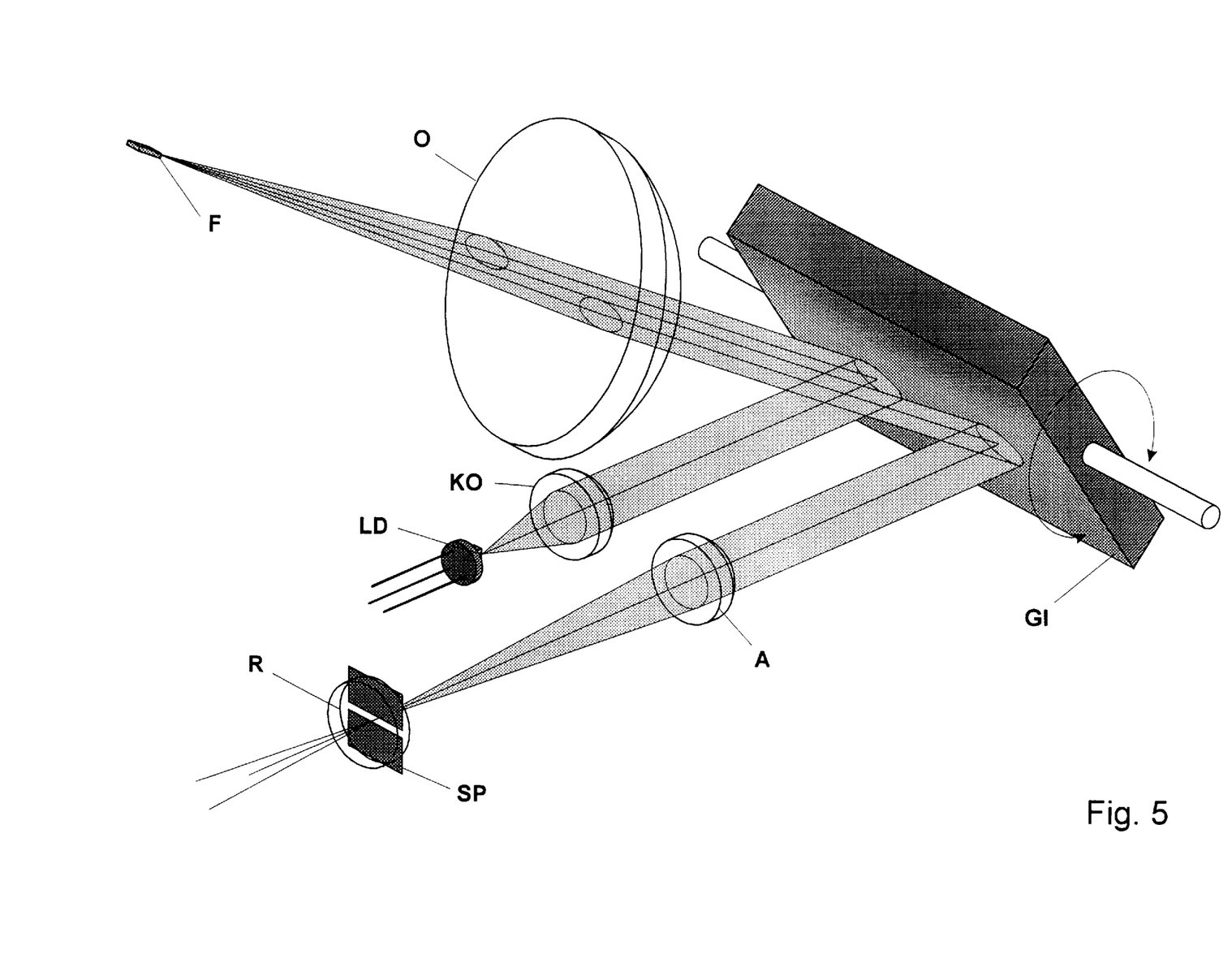
FIG. 5 shows a schematic representation of a third special embodiment.

The radiation which in the present case is emitted from the laser diode LD dereflected on one side, and largely transformed into a parallel beam by collimator KO is diffracted a first time by grating GI and passed into the lens O, namely, in parallel displacement relative to the optical axis of same. The lens O generates a preferably diffraction-limited image around its focus. At this site, a highly reflecting, plane facet is arranged which is thin in dispersion direction and at the same time, acts as a first space filter and a first reflector. The radiation of narrow wavelength range, which is reflected from this facet is re-passed into the lens O, namely, with a correspondingly opposite displacement relative to the optical axis thereof, as compared to the forward beam. Thereafter, the radiation is diffracted a second time at the grating GI and passed into a projection lens A which, in turn, generates a diffraction-limited image of the laser facet on the partially transmitting reflector R. The space filter SP substantially arranged in the same plane as reflector R and designed as a slit, additionally blocks radiation outside the selected wavelength interval. Because the reflector is designed so as to be partially transmitting, part of the selected radiation re-passes the optical path in opposite direction and is coupled back into the laser diode with high stability.

Above all, the advantage of this embodiment over the basic variant is that the radiation passes the grating twice at different positions prior to decoupling and thus, the decoupled fraction of scattered light, though low but not avoidable, is reduced dramatically by the grating. In addition, the facet F works as a defined entrance slit in the second pass. Conveniently, it is arranged as a stable profile (e.g., H shape) in a cavity, the walls of which are substantially black and do not exhibit any Raman effect. Reasonably, the optical path from the laser diode and the optical path to the reflector R are shielded from each other by a diaphragm array, so that the minimum possible amount of scattered light, e.g., from the grating, reaches the slit SP.

Since the radiation coupled back into the laser diode LD passes the grating four times in total, the available radiated power is somewhat less than in the basic variant. However, this loss of power is not important because gratings having very high diffraction efficiency are available.

Figure 6:
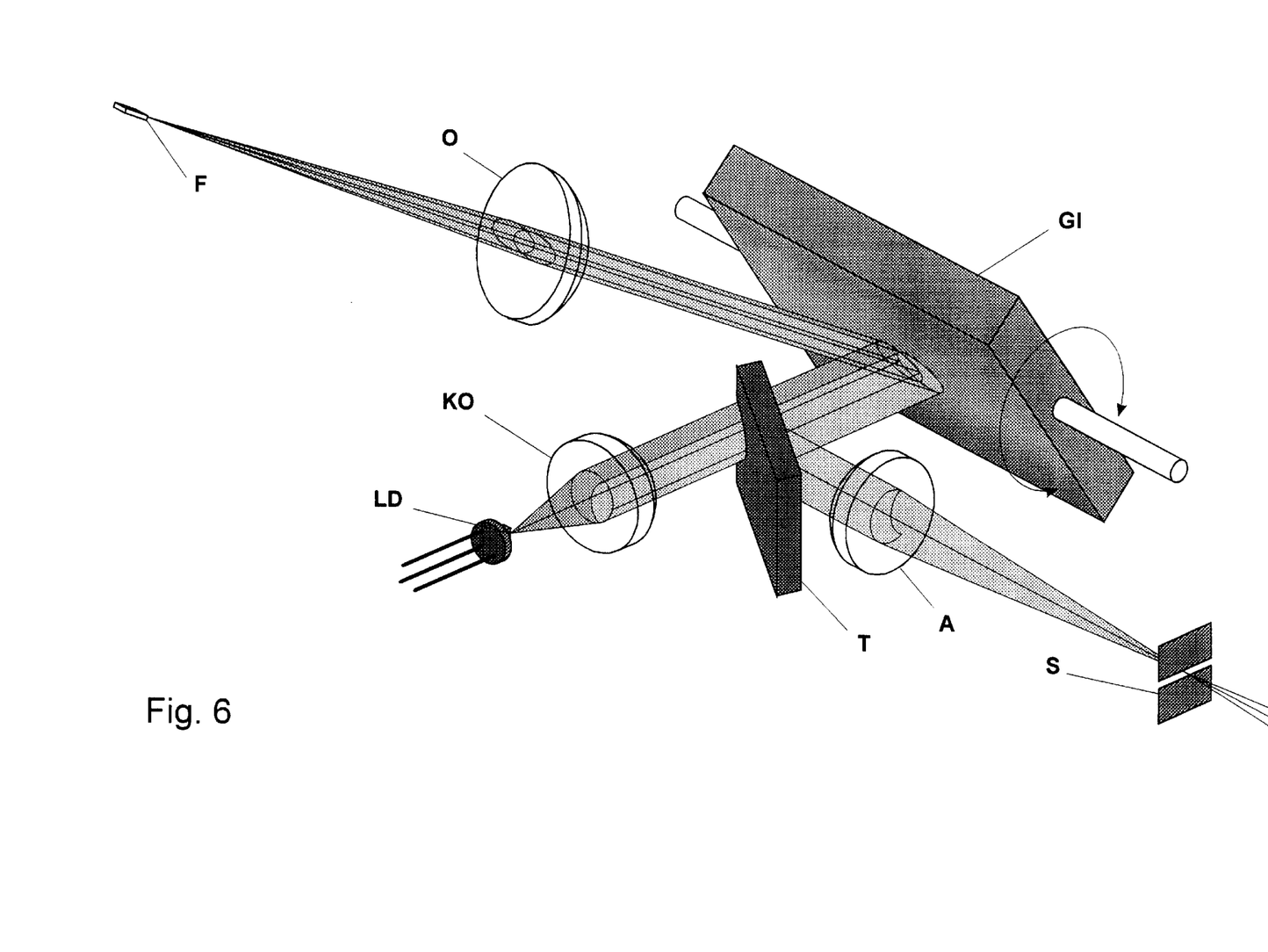
FIG. 6 shows a schematic representation of a fourth special embodiment.

A modification of this variant is shown in FIG. 6. Unlike in said variant, the beam with its central axis, after being diffracted a first time at the grating GI, strikes the lens O just slightly displaced out of the optical axis, so that this beam overlaps with the one reflected from facet F. The beam diffracted once again by the grating GI, in turn overlaps with the one emitted by the laser diode LD. In this fashion, the fraction of radiation diffracted a second time by the grating and overlapping with the forward beam may be used immediately for coupling back into the laser diode and, on the other hand, the non-overlapping fraction of the beam diffracted a second time at the grating GI may be masked out by a mirror T. The radiation conducted out of the resonator in this way is passed to a projection lens A, in the focal plane of which the exit slit SP is situated. Having passed twice the grating GI as in the previous example (FIG. 5), the usable radiation is provided at this site.

Another embodiment involves further simplification of the arrangement, wherein a reduction of the effective resonator length is achieved at the same time. In a first embodiment, the imaging lens O is omitted. Its function is taken over by the diffraction grating GI designed as an imaging grating for this purpose, which has substantially diffraction-limited imaging quality in the wavelength range used. In another embodiment, the imaging grating GI is designed to take over the function of the collimators KO as well.

Figure 7:
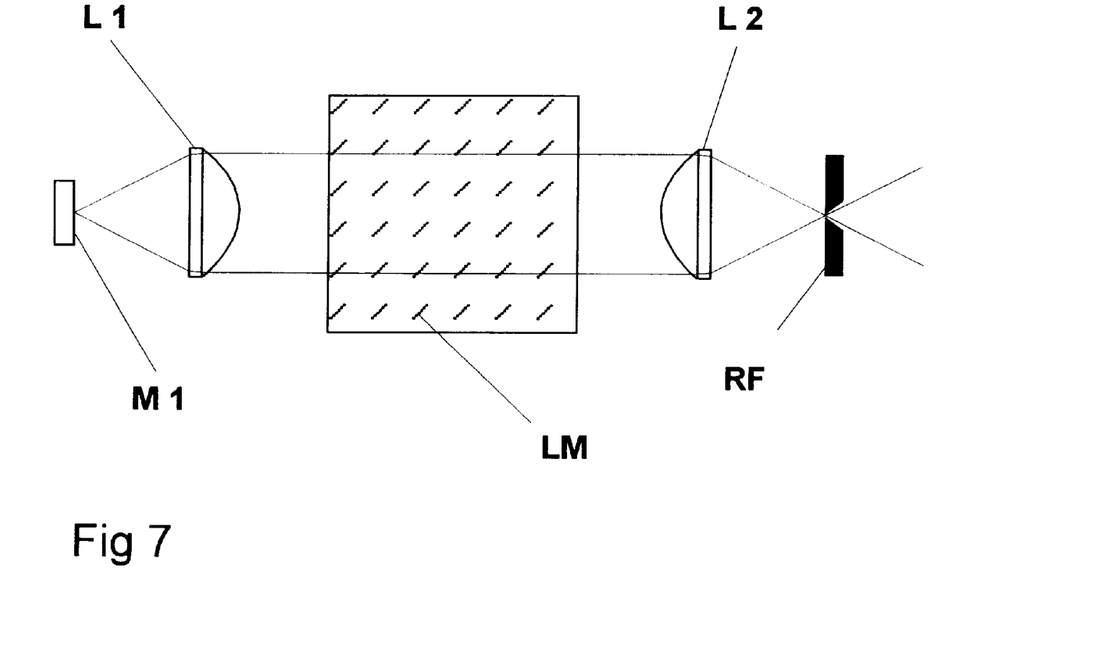
FIG. 7 shows a schematic representation of a special arrangement of the laser medium.

The applicability of the invention is not restricted to semiconductor laser arrangements. In place of the laser diode dereflected on one side, another suitable laser medium may be used, e.g., a dye together with an appropriate pumping source and a resonator terminal mirror, the optical path of which is imaged into a slit, for example. FIG. 7 illustrates one possible principle: a retroreflector consisting of a converging lens L1 and a mirror M1 serves as resonator terminal mirror. Another converging lens L2 projects the parallel optical path into a space filter. The laser medium LM is situated between the two converging lenses L1, L2. Such an arrangement may be used in place of a laser diode in the laser light source of the invention, the space filter RF playing the role of the exit facet of the laser diode dereflected on one side.

Figure 8:
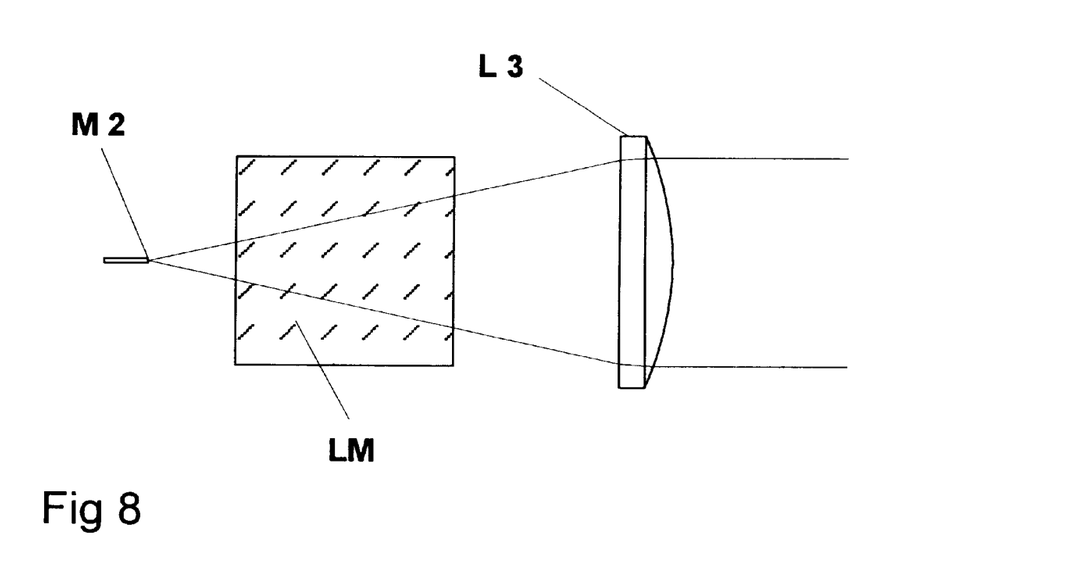
FIG. 8 shows a schematic representation of another special arrangement of the laser medium.

Another example is shown in FIG. 8. Here, the converging lens L3 plays the role of the collimator KO from FIGS. 2 to 6. A preferably plane mirror which is preferably small-dimensioned in the dispersion direction of the dispersing element GI (FIGS. 2 to 6) and placed in the focal plane of the converging lens L3, constitutes a retroreflector together with same. The laser light source is completed by arranging the laser medium LM in the optical path and arranging a suitable pump mechanism. Since in this case the defined exit facet in the form of a space filter RF or at least in the form of an optically effective exit facet of a laser diode is not present, a configuration according to FIG. 5 or FIG. 6 is particularly suitable.

The invention is not limited to the embodiments described herein. Rather, it is possible to implement other embodiments by combining the above features, without departing from the scope of the invention.

I claim:

1. A tunable laser light source, comprising a laser medium including a resonator terminal mirror, an imaging system (KO, O), an angular-dispersing element (GI), and a reflector (R) designed so as to be partially transmitting wherein, the reflector (R) situated at the site of the focus of the laser radiation defined by said imaging system (KO, O) and designed so as to be partially transmitting is arranged in such a fashion that together with at least a part (O) of the imaging system, it forms a largely direction-independent retroreflector according to the cat's eye principle, and at the same time, a space filter (SP) or an image thereof, slit-shaped in dispersion direction of the angular-dispersing element (GI), is situated at least approximately in the plane of reflector (R), the slit width extending in dispersion direction, so that only spectrally filtered radiation may pass the space filter (SP), thereby reaching the reflector (R), and the separation of back-coupled and decoupled, usable radiation is effected there, with high stability against maladjustment of the components perpendicularly to the dispersion direction of the angular-dispersing element (GI) and against inclination of the reflector (R).

2. A tunable laser light source, comprising a laser medium including a resonator terminal mirror, an angular-dispersing element (GI), an imaging system, and two reflectors (F, R), wherein in said laser light source, two retroreflectors (O, F; A, R) according to the cat's eye principle, each one constituted of a converging lens (O, A) and one of said reflectors (F, R), are arranged in the focal plane thereof, and in addition, optical means are arranged conducting the radiation emitted by the laser medium as a parallel beam to the dispersing element (GI), the optical axis of said means is arranged parallel to the optical axis of the second retroreflector (A, R), these two optical axes, after passing said dispersing element (GI), reach the first retroreflector (O, F) symmetrically and parallel to the optical axis thereof, and at the same time, the reflector (F) pertaining to the first retroreflector (O, F) is small in size with respect to the dispersion direction of the dispersing element (GI), so that only a narrow wavelength range of the radiation dispersed by the dispersing element (GI) is reflected therefrom, and at the same time, a slit-shaped space filter (SP) is arranged immediately before the reflector (R) of the second retroreflector (A, R), which filter likewise has transmittance in only a small geometrical dimension in the dispersion direction of the dispersing element (GI), so that again, only a narrow wavelength range of radiation having reached that far may pass the space filter (SP), and finally, the pertaining reflector (R) is designed so as to be partially transmitting, so that at this site, the radiation filtered by double dispersion is conducted out of the resonator on the one hand, and on the other hand, the reflected fraction of the filtered radiation is coupled back into the laser medium (LD) on the reverse way.

3. A tunable laser light source, comprising a laser medium, including a resonator terminal mirror, an angular-dispersing element (GI), an imaging system, and two reflectors (F, T), wherein in said laser light source, a retroreflector (O, F) according to the cat's eye principle, constituted of a converging lens (O) and a reflector (F) is arranged in the focal plane thereof, and in addition, optical means are arranged conducting the radiation emitted by the laser medium as a parallel beam to the dispersing element (GI), the optical axis of said means, after passing said dispersing element (GI), reaches the retroreflector (O, F) in parallel displacement relative to the optical axis thereof, the reflector (F) pertaining to said retroreflector (O, F) being small in size with respect to the dispersion direction of the dispersing element (GI), so that only a narrow wavelength range of the radiation dispersed by the dispersing element (GI) is reflected, the beams passing through the converging lens (O) in forward and reverse directions overlapping partially, so that also within the beam cross section emitted by the laser medium, a fraction of the beam dispersed a second time by said dispersing element (GI) strikes the laser medium again, and at the same time, essentially the non-overlapping fraction of the beam dispersed a second time by the dispersing element is passed via mirror (T) to a converging lens (A) having a slit-shaped space filter (S) arranged in the focal plane thereof, which filter has transmittance in only a small geometrical dimension in the dispersion direction of the dispersing element, so that at this site again, only a narrow wavelength range of radiation having reached that far is conducted out of the resonator as usable radiation.

4. The tunable laser light source according to claim 1 wherein, the dispersing element (GI) completely or partially takes over the function of the imaging system as well.

5. The tunable laser light source according to claim 1, wherein the partially reflecting front surface of an optical waveguide (LWL) serves as reflector (R), so that the usable, spectrally filtered laser power is available at the exit thereof.

6. The tunable laser light source according to claim 1, wherein the partially reflecting, not necessarily first surface of a decoupling lens (L) serves as reflector (R).

7. The tunable laser light source according to claim 1, wherein the dispersing element (GI) is a diffraction grating.

8. The tunable laser light source according to claim 7, wherein a 90° polarization rotator (PD) is arranged before the diffraction grating (GI) as viewed in beam direction, in order to use the. diffraction grating (GI) at maximum diffraction efficiency in dependence of the polarization direction of the laser radiation, the radiation coupled back into the laser medium (LD) striking same in the original direction of polarization.

9. The tunable laser light source according to claim 1, wherein
a semiconductor laser serves as laser medium (LD).

10. The tunable laser light source according to claim 9, wherein
the exit facet of the semiconductor laser is substantially dereflected.

11. The tunable laser light source according to claim 1, wherein
a line of semiconductor lasers serves as the laser medium.

12. The tunable laser light source according to claim 11, wherein
the partially reflecting entrance facet of an optical waveguide is present at the site of each single laser image, so that multiple, synchronously tunable laser light sources are provided and thus, the radiation of these single laser light sources may be conveyed simultaneously to sites relatively far apart from each other.

13. The tunable laser light source according to claim 1, wherein
a collimator (KO) is arranged between the laser medium and the dispersing element (GI).

14. The laser light source according to claim 1, wherein
a configuration comprising a resonator terminal mirror or a retroreflector (L1, M1), the laser medium itself, a lens (L2) and a space filter in the focal plane thereof is present as the laser medium including said resonator terminal mirror, said configuration is arranged so that the space filter is located in the rear focal plane of lens KO instead of the exit facet of a laser diode.

15. The laser light source according to claim 1, wherein
a resonator terminal mirror is arranged in the rear focal plane of lens KO instead of the exit facet of a laser diode, and the laser medium may be at any position between said resonator terminal mirror (M2) and the dispersing element (GI).

16. The laser light source according to claim 15, wherein
the resonator terminal mirror (M2) has only small geometrical dimensions in the dispersion direction of the dispersing element (GI).

17. A method for obtaining spectrally filtered laser radiation for decoupling from and simultaneously back-coupling into a laser resonator, wherein the beam emitted by a laser medium including a resonator terminal mirror is angular-dispersed across its direction of propagation, then focussed, filtered in the focus or the proximity thereof in such a way that only a narrow wave-length range of the radiation is passed on, reflection of the non-transmitted fraction of radiation back into the resonator being substantially prevented, and eventually, after filtering also effected in the focus or an image of the focus, a fraction of the radiation is reflected into the laser resonator through a reflector designed so as to be partially transmitting, and another fraction is transmitted in order to use the laser radiation, wherein
subsequent to focussing the laser radiation, filtering takes place in the focus or an image of the focus, and reflection in association with said focussing is effected perpendicularly to the dispersion direction, according to the principle of a largely direction-independent retroreflector according to the cat's eye principle.

18. The method according to one of claim 17, wherein
the separation of the back-coupled and decoupled radiation is effected at one single surface.

19. A method for obtaining spectrally filtered laser radiation for decoupling from and simultaneously back-coupling into a laser resonator, wherein
the beam emitted by a laser medium including a resonator terminal mirror is dispersed across its direction of propagation and focussed, filtered and simultaneously reflected in the focus or the proximity thereof in such a way that only a narrow wavelength range of the radiation is returned, focussing and reflection being effected together according to the principle of a largely direction-independent retroreflector according to the cat's eye principle, forward and reverse beams being displaced parallel to each other but passing the same element, dispersion being effected a second time at the same element as in the first time, focussing is effected again, spatial filtering through a slit-shaped space filter is effected in the focus or the proximity thereof in such a way that only a narrow wavelength range of the radiation is passed on and eventually, after filtering also effected in the focus or an image of the focus, partial reflection takes place at a reflector designed so as to be partially transmitting, so that a fraction of the radiation returns to the laser medium on the same path, and another fraction is transmitted in order to use the laser radiation.

20. A method for obtaining spectrally filtered laser radiation for decoupling from and simultaneously back-coupling into a laser resonator, wherein
the beam emitted by a laser medium including a resonator terminal mirror is dispersed across its direction of propagation and focussed, filtered and simultaneously reflected in the focus or the proximity thereof in such a way that only a narrow wavelength range of the radiation is returned, focussing and reflection being effected together according to the principle of a largely direction-independent retroreflector according to the cat's eye principle, forward and reverse beams being displaced parallel to each other so as to partially overlap each other, dispersion being effected a second time at the same element as in the first time, the non-overlapping beam fraction is separated and refocussed, spatial filtering through a slit-shaped space filter is effected in the focus or the proximity thereof in such a way that only a narrow wavelength range of the radiation issues from the laser resonator for use of the laser radiation, while the overlapping beam fraction returns into the laser medium.

* * * * *